United States Patent
Chen et al.

(10) Patent No.: US 7,332,777 B2
(45) Date of Patent: Feb. 19, 2008

(54) STI LINER FOR SOI STRUCTURE

(75) Inventors: Kuang-Hsin Chen, Hsin-Chu (TW);
Hsun-Chih Tsao, Hsin-Chu (TW);
Hung-Wei Chen, Hsin-Chu (TW);
Di-Hong Lee, Hsin-Chu (TW);
Chuan-Ping Hou, Tainan (TW);
Jhi-Cherng Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/221,200

(22) Filed: Sep. 7, 2005

(65) Prior Publication Data
US 2006/0012004 A1    Jan. 19, 2006

Related U.S. Application Data

(62) Division of application No. 10/747,494, filed on Dec. 29, 2003, now Pat. No. 6,955,955.

(51) Int. Cl.
*H01L 31/0392* (2006.01)
(52) U.S. Cl. ............... 257/349; 257/347; 257/E21.564
(58) Field of Classification Search ................ 257/354
See application file for complete search history.

(56) References Cited

U.S. PATENT DOCUMENTS

| | | | | |
|---|---|---|---|---|
| 4,751,554 | A * | 6/1988 | Schnable et al. | 257/354 |
| 6,048,756 | A * | 4/2000 | Lee et al. | 438/151 |
| 6,064,090 | A * | 5/2000 | Miyamoto et al. | 257/347 |
| 6,319,794 | B1 * | 11/2001 | Akatsu et al. | 438/424 |
| 6,509,583 | B1 * | 1/2003 | Iwamatsu et al. | 257/59 |
| 6,521,510 | B1 | 2/2003 | Fisher et al. | |
| 6,556,198 | B1 | 4/2003 | Nishikawa | |
| 6,566,680 | B1 | 5/2003 | Krivokapic | |
| 6,723,594 | B2 * | 4/2004 | Rhodes | 438/200 |
| 6,838,733 | B2 * | 1/2005 | Takehiro | 257/347 |
| 6,870,225 | B2 | 3/2005 | Bryant et al. | |
| 2002/0022308 | A1 | 2/2002 | Ahn et al. | |
| 2002/0171104 | A1 * | 11/2002 | Cable et al. | 257/347 |
| 2005/0101072 | A1 | 5/2005 | Bryant et al. | |
| 2005/0130361 | A1 * | 6/2005 | Balasubramanian et al. | 438/197 |

OTHER PUBLICATIONS

Richard C. Jaeger, Introduction to Microelectronic Fabrication, 2002, vol. 5, pp. 226-227.*

* cited by examiner

*Primary Examiner*—Minhloan Tran
*Assistant Examiner*—Eduardo A. Rodela
(74) *Attorney, Agent, or Firm*—Slater & Matsil, L.L.P.

(57) ABSTRACT

In a method of manufacturing a semiconductor device, an initial structure is provided. The initial structure includes a substrate, a patterned silicon layer, and a covering layer. The substrate has a buried insulator layer formed thereon. The patterned silicon layer is formed on the buried insulator layer. The covering layer is formed on the patterned silicon layer. A first layer is formed on the initial structure. Part of the first layer is removed with an etching process, such that a sidewall portion of the patterned silicon layer is exposed and such that a remaining portion of the first layer remains at a corner where the patterned silicon layer interfaces with the buried insulator layer. An oxide liner is formed on the exposed sidewall portion. A recess may be formed in the buried insulator layer (prior to forming the first layer) and may extend partially beneath the patterned silicon layer.

18 Claims, 8 Drawing Sheets

STI LINER FOR SOI STRUCTURE

This application is a divisional of patent application Ser. No. 10/747,494, entitled "STI Liner For SOI Structure," filed on Dec. 29, 2003 now U.S. Pat. No. 6,955,955 which application is incorporated herein by reference.

TECHNICAL FIELD

The present invention generally relates to the fabrication of semiconductor devices. In one aspect it relates more particularly to a liner for a shallow trench isolation (STI) in a silicon-on-insulator (SOI) structure.

BACKGROUND

A silicon-on-insulator (SOI) structure is sometimes used in forming semiconductor devices. In a typical SOI structure, an insulator layer is formed in-between a silicon wafer. Often this insulator layer is a silicon dioxide layer referred to as a "buried oxide" layer, a "bottom oxide" layer, and/or a "BOX" layer. After the silicon is patterned, valleys or trenches remaining between the patterned silicon structures are typically filled with insulating material, such as silicon dioxide, to form shallow-trench-isolation (STI).

Figure 1:
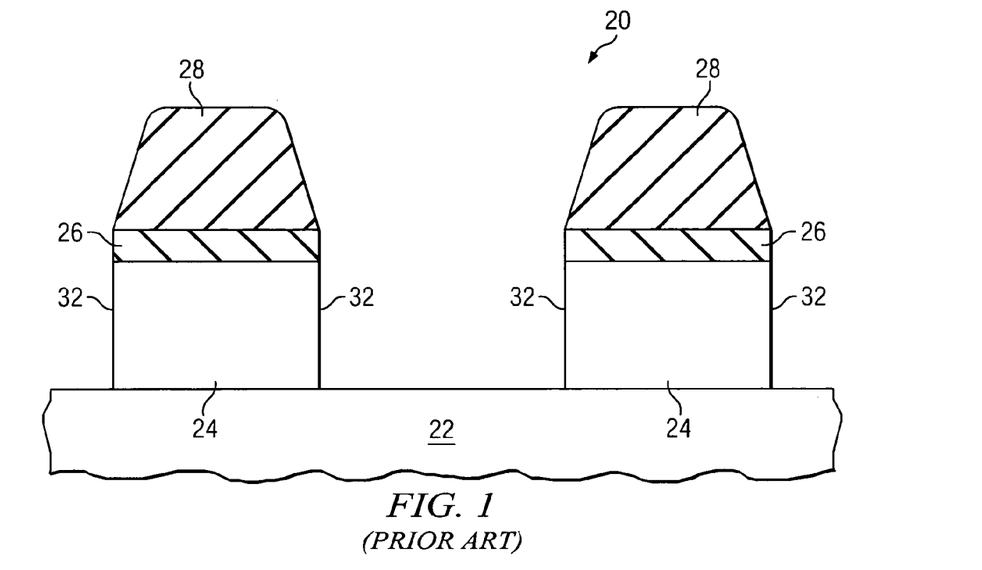
FIGS. 1-4 illustrate a prior method of forming a thermally grown oxide liner on sidewalls of a patterned silicon layer for an SOI structure.

When the silicon is etched to pattern the silicon in an SOI structure, the vertical sidewalls of the silicon are often damaged during the process. To address this issue, manufacturers sometimes grow an oxide liner on the vertical sidewalls of the silicon. The oxide liner improves or rebuilds the sidewalls of the silicon. FIGS. 1-4 illustrate a prior process used to develop such an SOI structure having oxide liners. In FIG. 1, an initial structure 20 is shown. In this initial structure, a BOX layer 22 is formed on a silicon wafer (not shown). The silicon 24 formed on the BOX layer 22 has been patterned already in FIG. 1. The patterned silicon 24 in FIG. 1 still has a layer of pad oxide 26 thereon. A patterned layer of silicon nitride 28 is on the pad oxide layer 26. The patterned silicon nitride layer 28 was used here as a mask during the etching of the silicon 24. The pad oxide layer 26 may have been used as an etch stop layer during the development of the silicon nitride mask 28. The silicon 24 may be patterned using a reactive-ion-etching (RIE) or dry etching process, for example. Hence, this structure shown in FIG. 1 is a common initial or intermediate structure for a process of fabricating an SOI structure.

Figure 2:
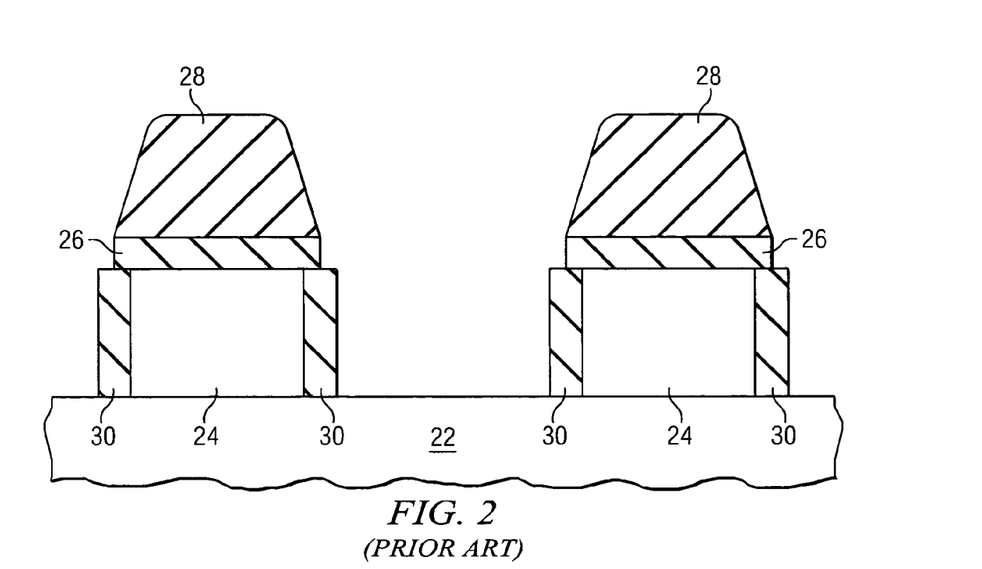
Figure 3:
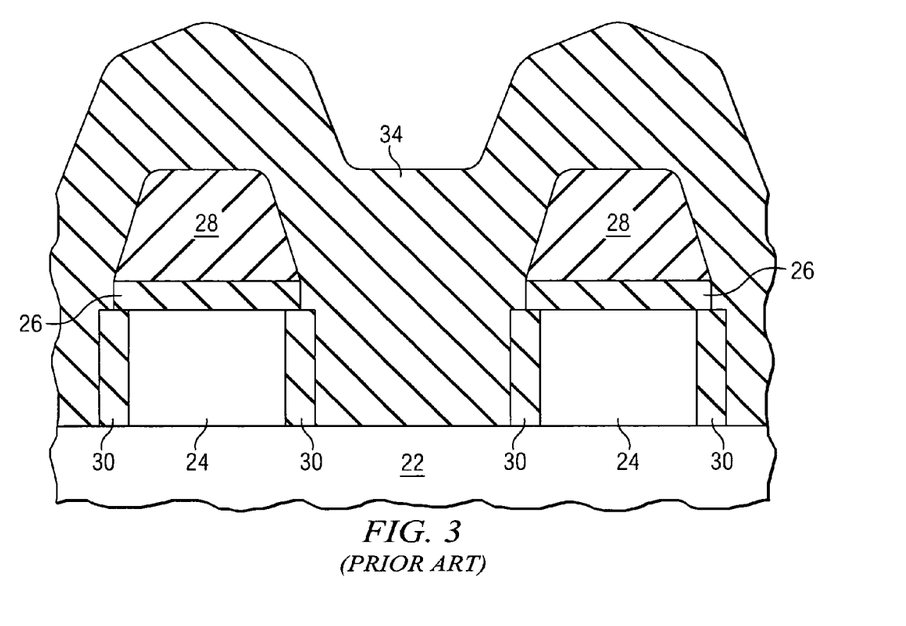
Figure 4:
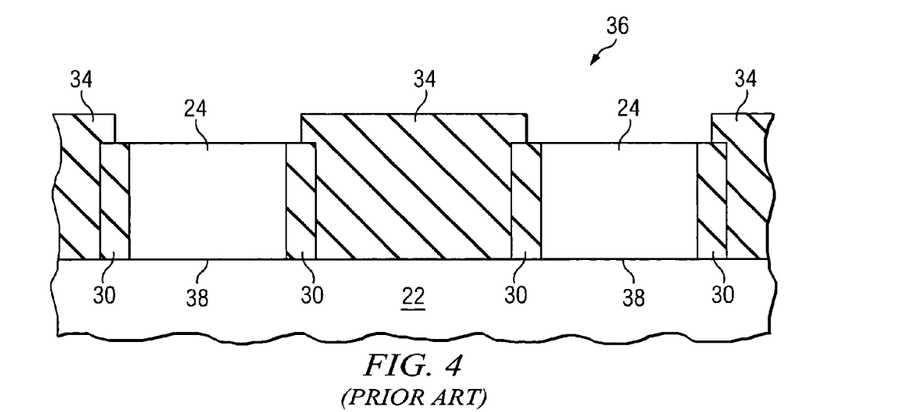

After patterning the silicon 24, an oxide liner 30 may be thermally grown on the vertical sidewalls 32 of the silicon 24, as shown in FIG. 2, for example. With the pad oxide layer 26 and/or the nitride layer 28 still present, as in FIG. 2, the oxide liner 30 is only grown on the exposed vertical sidewall portions 32 of the silicon 24. As shown in FIG. 3, after the liners 30 are formed, an insulting material 34 is deposited to fill the gaps between the patterned silicon structures 24 (i.e., for forming the STI). Such insulating material 34 may be silicon dioxide, for example. Such insulating material 34 is typically deposited using a high-density-plasma chemical-vapor-deposition (HDP-CVD) process, which may be a well known process. Subsequently, the nitride layer 28, the pad oxide layer 26, and part of the STI insulating material 34 are removed (e.g., by chemical mechanical polishing (CMP) and/or by etching) to provide an SOI structure 36, such as that shown in FIG. 4.

Figure 5:
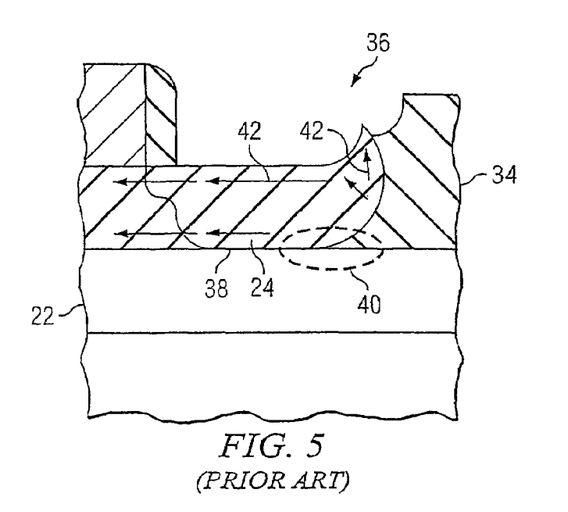
FIG. 5 shows a side view of a prior SOI structure to illustrate the strain on the silicon.

Recent studies have found that the prior method shown in FIGS. 1-4 yields a structure where the liner 30 exerts stress on the silicon 24 at the interface 38 of the silicon 24 and the BOX layer 22. Typically, such stress is highest at the edges of the silicon 24. The stress exerted on the silicon 24 may be upward along the sidewalls 32 and compressive towards the channel region. This stress is believed to be caused by the thermal growth process for forming the oxide liners 30 because the growth will occur in all directions, including vertically along the silicon sidewalls 32. As the oxide liners 30 are grown (see e.g., FIG. 2), the growth often extends into the BOX layer 22 (at the interface of the silicon 24 and the BOX layer 22). This may cause lifting of and/or lifting stress on the silicon 24 at the liner 30 (i.e., at the edge of the silicon 24). This is illustrated in FIG. 5. In FIG. 5, the silicon edge has been lifted and a "bird's beak" 40 of insulating material has formed under the edge of the silicon 24 at the interface 38. This bird's beak portion 40 keeps the silicon 24 under strain, as illustrated by the arrows 42 in FIG. 5, which is usually undesirable. Hence, a need exists for ways to reduce or eliminate this unwanted strain on the silicon 24 of the SOI structure 36.

SUMMARY OF THE INVENTION

The problems and needs outlined above may be addressed by embodiments of the present invention. In accordance with one aspect of the present invention, a method of manufacturing a semiconductor device is provided. This method includes the following steps described in this paragraph, and the order of the steps may vary. An initial structure is provided. The initial structure includes a substrate and a patterned silicon layer. The substrate has a buried insulator layer formed thereon. The patterned silicon layer is formed on the buried insulator layer. A first layer is formed on the initial structure. Part of the first layer is removed with an etching process, such that a sidewall portion of the patterned silicon layer is exposed and such that a remaining portion of the first layer remains at a corner where the patterned silicon layer interfaces with the buried insulator layer. An oxide liner is formed on the exposed sidewall portion.

In accordance with another aspect of the present invention, a semiconductor device is provided, which includes a substrate, a buried insulator layer, a patterned silicon layer, an oxide liner, and a first layer. The buried insulator layer is formed over the substrate. The patterned silicon layer is formed over the buried insulator layer. The oxide liner is thermally grown on a sidewall of the patterned silicon layer, but the oxide liner extends along only part of the sidewall. A portion of the first layer extends along another part of the sidewall and in a corner at an interface of the patterned silicon layer and the buried insulator layer. The first layer may include an insulating material, such as silicon dioxide, for example. Alternatively, the first layer may include silicon nitride. The portion of the first layer may cover at least part of the buried insulator layer.

In accordance with yet another aspect of the present invention, a method of manufacturing a semiconductor device is provided. This method includes the following steps described in this paragraph, and the order of the steps may vary. An initial structure is provided. The initial structure includes a substrate and a patterned silicon layer. The substrate has a buried insulator layer formed thereon. The patterned silicon layer is formed on the buried insulator layer. The buried insulator layer is etched to form a recess in the buried insulator layer and this forms an intermediate structure. Part of the recess extends at least partially beneath the patterned silicon layer. After the etching of the buried insulator layer, a first layer is formed on the intermediate structure. The first layer at least partially fills the recess. Part of the first layer is removed with an etching process, such that a sidewall portion of the patterned silicon layer is exposed and such that a remaining portion of the first layer remains below the patterned silicon layer in the recess. An oxide liner is formed on the exposed sidewall portion.

In accordance with another aspect of the present invention, a semiconductor device is provided, which includes a substrate, a buried insulator layer, a patterned silicon layer, an oxide liner, and a first layer. The buried insulator layer is formed over the substrate. The patterned silicon layer is formed over the buried insulator layer. The buried oxide has a recess formed therein. At least part of the recess extends at least partially beneath the patterned silicon layer. A portion of the first layer is formed in the recess beneath the patterned silicon layer. The oxide liner is thermally grown on a sidewall of the patterned silicon layer. The oxide liner may extend along only a first portion of the sidewall of the patterned silicon layer and the portion of the first layer may extend along a second portion of the sidewall of the patterned silicon layer. The first layer may include silicon nitride and/or silicon dioxide, for example.

The foregoing has outlined rather broadly features of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The following is a brief description of the drawings, which illustrate exemplary embodiments of the present invention and in which.

DETAILED DESCRIPTION OF ILLUSTRATIVE EMBODIMENTS

Referring now to the drawings, wherein like reference numbers are used herein to designate like elements throughout the various views, illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Figure 6:
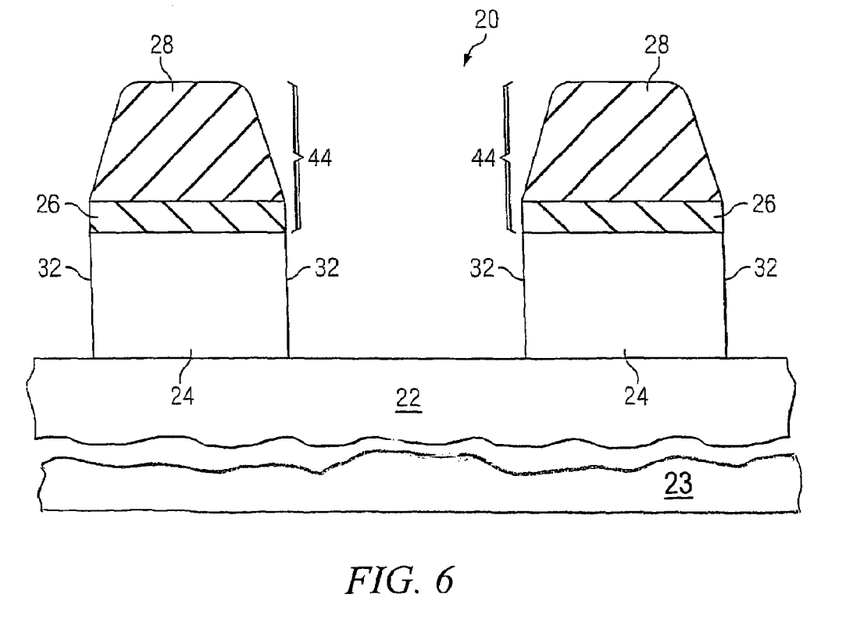
FIGS. 6-10 illustrate a method of forming an SOI structure in accordance with a first embodiment of the present invention.

FIGS. 6-10 illustrate a method of forming an SOI structure 36 in accordance with a first embodiment of the present invention. In FIG. 6, an example initial structure 20 is provided. This initial structure 20 has a buried insulator layer 22 formed on a substrate 23. The substrate may be a silicon wafer and the buried insulator layer 22 may be silicon dioxide, for example. A patterned silicon layer 24 is formed on the buried insulator layer 22. Although referred to herein as a "silicon" layer, the patterned silicon layer 24 may include one or more layers and/or one or more materials. For example, the patterned silicon layer 24 may be (but not necessarily limited to) epitaxially grown silicon, epitaxially grown SiGe, or combinations thereof (e.g., strained silicon structure with silicon layer under biaxial tension).

The patterned silicon layer 24 may be formed using a common masking and etching process, for example. In the example initial structure 20 shown in FIG. 6, the patterned silicon layer 24 has a covering layer 44 formed on a top surface of the patterned silicon layer 24. In this example, the covering layer 44 has pad oxide layer 26 formed on the patterned silicon layer 24 and a silicon nitride mask layer 28 formed on the pad oxide layer 26, for example, which may have been used in forming the patterned silicon layer 24. Hence, for purposes of comparison, the initial structure 20 of FIG. 6 is the same as that shown in FIG. 1. In other embodiments (not shown), the entire covering layer 44 or some part of the covering layer 44 (e.g., the silicon nitride mask layer 28) may be removed already in the initial structure 20. One of ordinary skill in the art will likely realize other possible initial structures.

Figure 7:
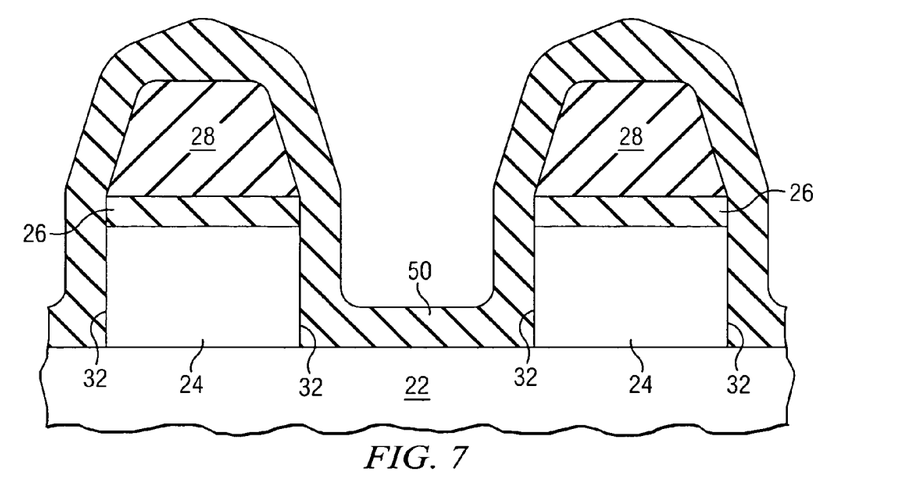

In FIG. 7, a first layer 50 has been formed on the initial structure 20 of FIG. 6. The first layer 50 is preferably substantially conformal, as shown in FIG. 7. In a preferred process of forming the first layer 50, a high-density-plasma chemical-vapor-deposition (HDP-CVD) process is used. However, other processes for forming the first layer 50 may be used (e.g., CVD). The first layer 50 of the first embodiment is an insulating material, such as an oxide or silicon dioxide, for example. In other embodiments, however, the first layer 50 may be made from any of a variety of appropriate materials.

Figure 8:
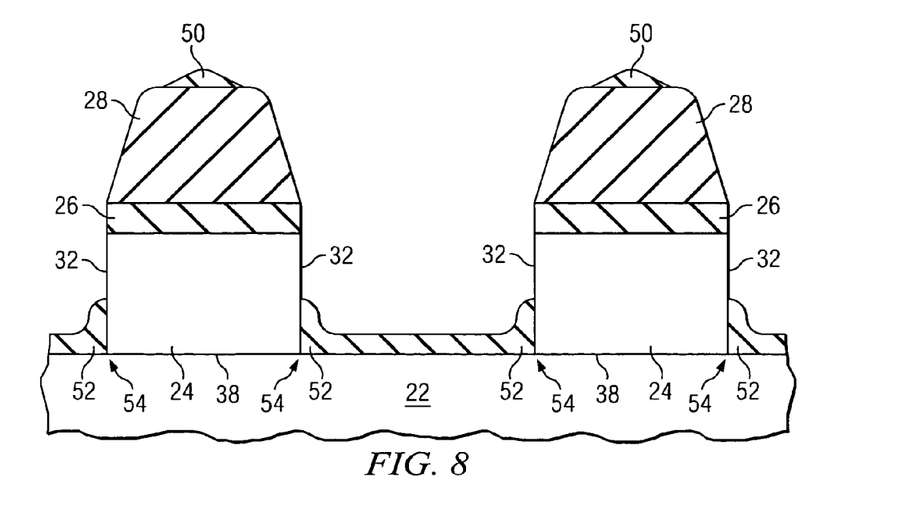

After forming the first layer 50, part of the first layer 50 is removed with an etching process, as shown in FIG. 8, for example. In this example, the etching process is a wet etching process, which is preferred here, but other etching techniques may be used (e.g., RIE etching, dry etching). The goal of this etching step is to remove part of the first layer 50 in a way that sidewall portions 32 of the patterned silicon layer 24 becomes exposed and so that remaining portions 52 of the first layer 50 remain at the corners 54 where the patterned silicon layer 24 interfaces with the buried insulator layer 22. A preferred result of the etching process is that remaining portions of the first layer 50 cover a lower part of the sidewalls 32 of the patterned silicon layer 24 and cover the buried insulator layer 22, as shown in FIG. 8. In other embodiments (not shown), the remaining portions 52 of the first layer 50 may cover less or more of the sidewalls 32 of the patterned silicon layer 24 and/or less of the buried insulator layer 22.

Figure 9:
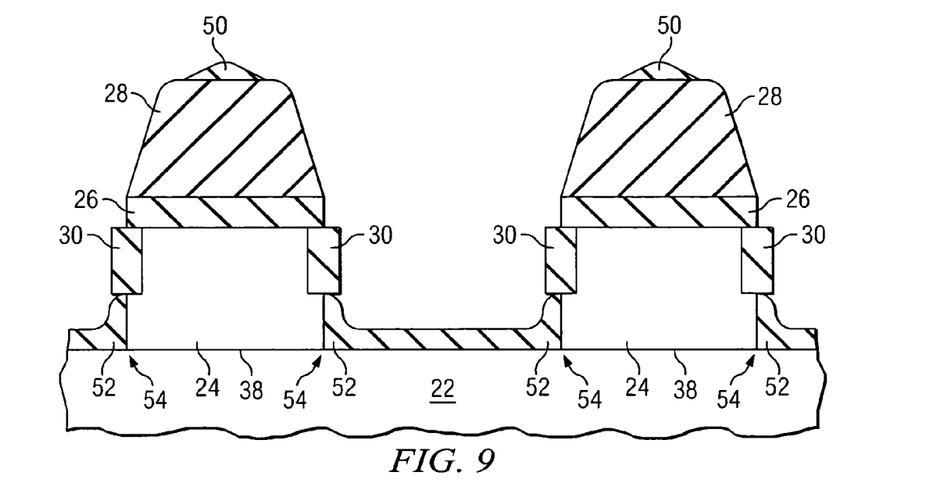

The next step in forming the SOI structure 36 of the first embodiment is to form an oxide liner 30 on the exposed portions (see e.g., FIG. 8) of the patterned silicon layer 24, as shown in FIG. 9, for example. In a preferred embodiment, the oxide liner 30 is thermally grown on the exposed portions of silicon 24. Preferably, only a middle and upper portion of the sidewalls 32 of the patterned silicon layer 24 are exposed on the sidewalls 32 so that only those portions are oxidized and so that the oxide liner 30 will be formed there. Hence, it is preferred to have some layer covering the top surface of the patterned silicon layer 24, such as the covering layer 44. If the covering layer 44 is not present prior to forming the first layer 50, part of the first layer 50 may be left on the top surface of the silicon layer 24 to protect it from being oxidized while forming the oxide liners 30.

By having the remaining portions 52 of the first layer 50 in the corners 54 at the interface 38 of the silicon layer 24 and the buried insulator layer 22, the remaining portions 52 of the first layer 50 preferably prevent the oxide liner 30 from growing down to the interface 38 of the silicon layer 24 and the buried insulator layer 22. This may prevent or significantly reduce the stresses on the silicon layer 24 (i.e., upward stress on silicon layer 24 at the edges or at the sidewalls 32, compressive stress on the silicon layer 24) (see e.g., FIG. 5) and/or significantly reduce or eliminate the bird's beak formation 40 shown in FIG. 5.

Figure 10:
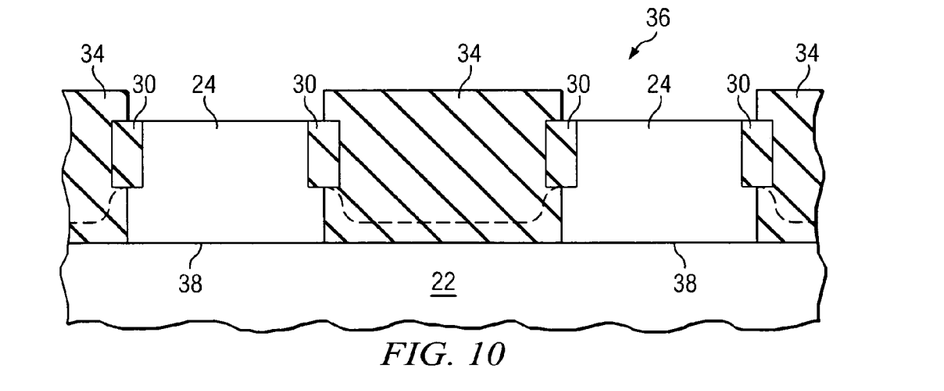

Referring now to FIG. 10, the regions adjacent to the patterned silicon layer 24 have been filled with insulating material 34 to form the STI. Also, the pad oxide layer 26 and silicon nitride mask layer 28 have been removed at this point.

Figure 11:
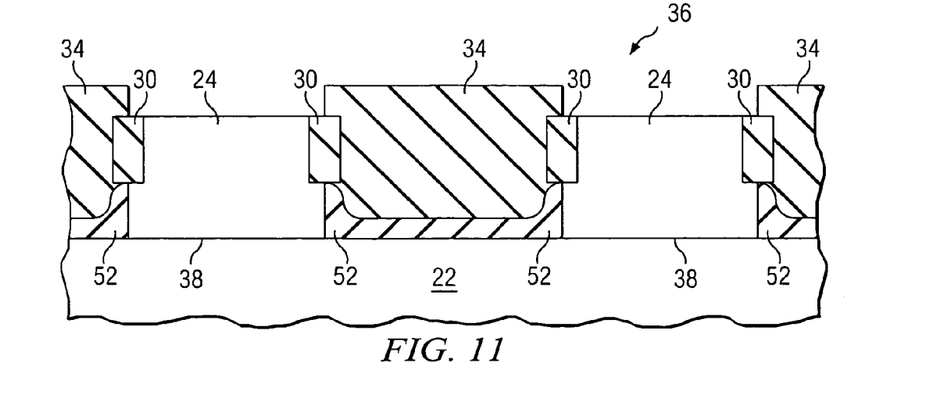
FIG. 11 illustrates an SOI structure in accordance with a second embodiment of the present invention.

As noted above, the first layer 50 may be made from a variety of materials. FIG. 11 shows an SOI structure 36 in accordance with a second embodiment of the present invention. The method of forming the second embodiment may be essentially the same as that described for the first embodiment (see e.g., FIGS. 6-10), except that the material choice for the first layer 50 is changed. In the second embodiment, the first layer 50 is made from silicon nitride, for example.

Figure 12:
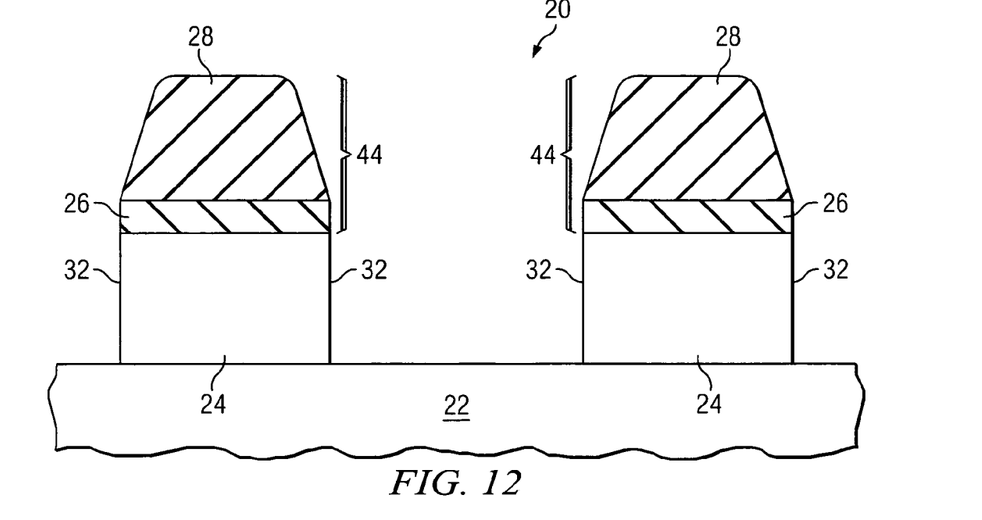
FIGS. 12-17 illustrate a method of forming an SOI structure in accordance with a third embodiment of the present invention.

FIGS. 12-17 illustrate a method of forming an SOI structure 36 in accordance with a third embodiment of the present invention. In FIG. 12, an example initial structure 20 is provided, which is the same as that of FIGS. 1 and 6, for purposes of comparison. As with the other embodiments, the initial structure 20 may vary from that shown in FIG. 12.

Figure 13:
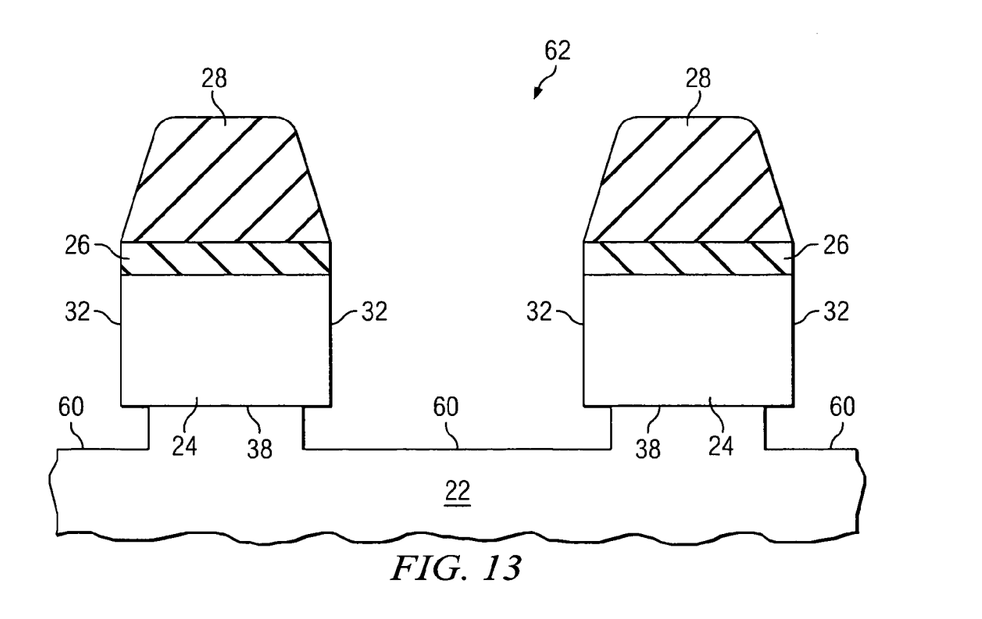

As shown in FIG. 13, the buried insulator layer 22 is etched to form a recess 60 in the buried insulator layer 22. Part of the recess 60 extends partially beneath the patterned silicon layer 24, as shown in FIG. 13, for example. This may be provided by using a wet etching technique to form the recess 60 with an etch chemistry that is selective against etching the patterned silicon layer 24, for example. One of ordinary skill in the art may realize other ways or techniques to provide a recess 60 where part of the recess 60 extends partially under the patterned silicon layer 24.

Figure 14:
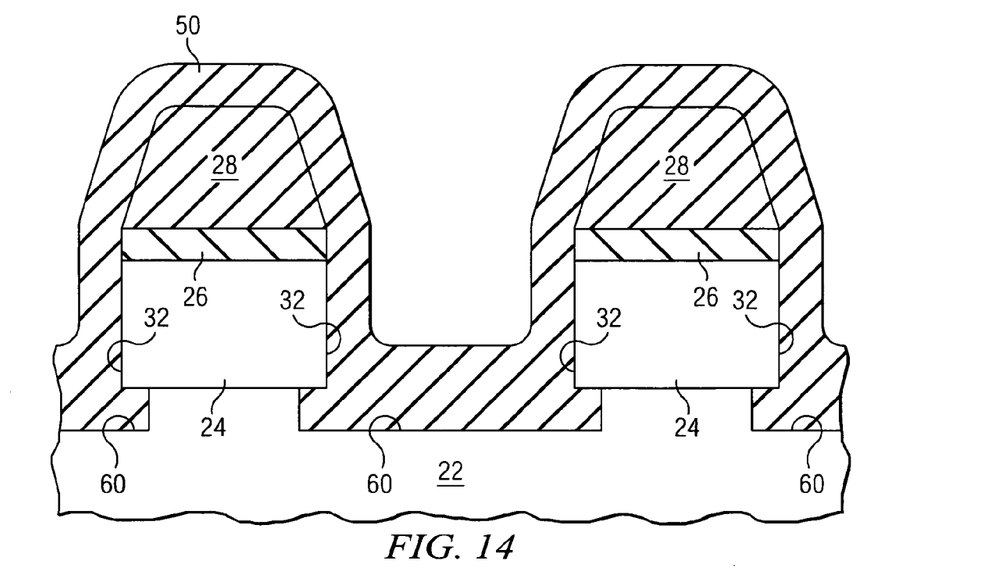

In FIG. 14, a first layer 50 has been formed over the intermediate structure 62 of FIG. 13. In FIG. 14, the first layer 50 overfills the recess 60, which is preferred. In other embodiments (not shown), however, the material of the first layer 50 may fill or partially fill the recess 60. The first layer 50 of the third embodiment is made from silicon nitride, for example. The first layer 50 may be formed by chemical vapor deposition (CVD), for example. In other embodiments, the first layer 50 may be made from any of a variety of appropriate materials. The first layer 50 is preferably substantially conformal, as shown in FIG. 14, for example. It is preferred to get the first layer material 50 into the recess 60 beneath the patterned silicon layer 24.

Figure 15:
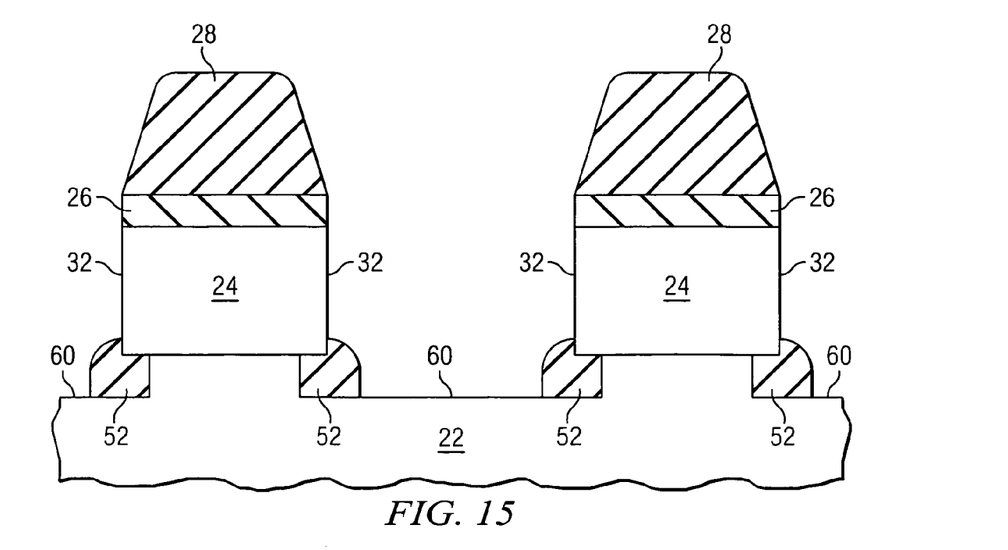

Next, part of the first layer 50 is removed with an etching process, so that sidewall portions 32 of the patterned silicon layer 24 are exposed and so that a remaining portion 52 of the first layer 50 remains in the recess 60 below the patterned silicon layer 24, as shown in FIG. 15 for example. In FIG. 15, a dry etch process has been performed to remove part of the first layer 50. The remaining portions 52 of the first layer 50 in FIG. 15 fill the part of the recess 60 beneath patterned silicon layer 24 and extend along a lower portion of the silicon layer sidewalls 32.

Figure 16:
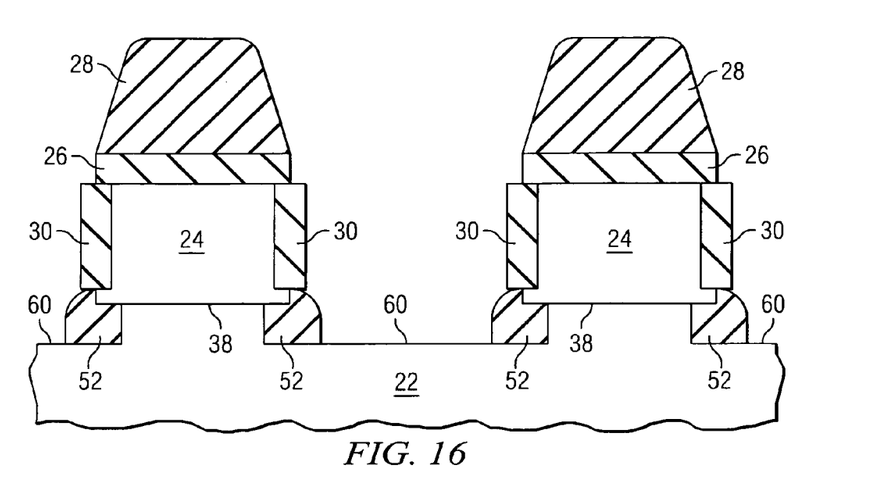

In FIG. 16, oxide liners 30 are formed on the exposed portions of the patterned silicon layer 24 (i.e., part of the sidewalls 32) of FIG. 15. In a preferred embodiment, the oxide liner 30 is thermally grown on the exposed portions of silicon 24. Preferably, only a middle and upper portion of the sidewalls 32 of the patterned silicon layer 24 are exposed on the sidewalls 32 so that only those portions are oxidized and so that the oxide liner 30 will be formed there. Hence, it is preferred to have some layer covering the top surface of the patterned silicon layer 24, such as the covering layer 44. If the covering layer 44 is not present prior to forming the first layer 50, part of the first layer 50 may be left on the top surface of the silicon layer 24 to protect it from being oxidized while forming the oxide liners 30.

By having the remaining portions 52 of the first layer 50 beneath the patterned silicon layer 24 and the buried insulator layer 22, the remaining portions 52 of the first layer 50 preferably prevent the oxide liner 30 from growing down to the interface 38 of the silicon layer 24 and the buried insulator layer 22. This may prevent or significantly reduce the stresses on the silicon layer 24 (i.e., upward stress on silicon layer 24 at the edges or at the sidewalls 32, compressive stress on the silicon layer 24) (see e.g., FIG. 5) and/or significantly reduce or eliminate the bird's beak formation 40 shown in FIG. 5.

Figure 17:
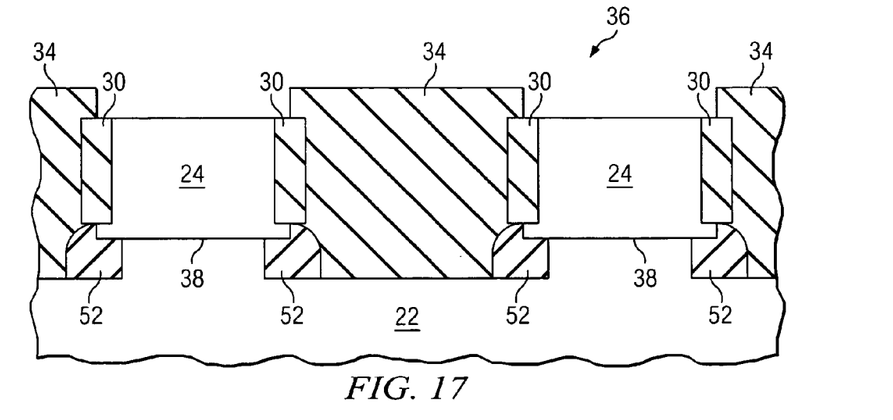

Referring now to FIG. 17, the regions adjacent to the patterned silicon layer 24 have been filled with insulating material 34 to form the STI. Also, the pad oxide layer 26 and silicon nitride mask layer 28 have been removed at this point.

Figure 18:
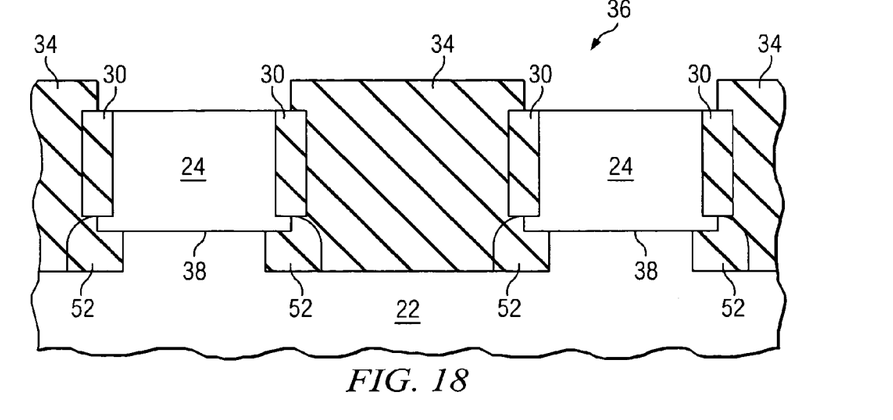
FIG. 18 illustrates an SOI structure in accordance with a fourth embodiment of the present invention.

As noted above, the first layer 50 may be made from a variety of materials. FIG. 18 shows an SOI structure 36 in accordance with a fourth embodiment of the present invention. The method of forming the fourth embodiment may be essentially the same as that described for the third embodiment (see e.g., FIGS. 12-17), except that the material choice for the first layer 50 is changed. In the fourth embodiment, the first layer 50 is made from silicon dioxide, for example.

Although embodiments of the present invention and at least some of its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device, comprising:
   a substrate;

a buried insulator layer formed over the substrate;

a patterned silicon layer formed over the buried insulator layer, wherein the buried insulator has a recess formed therein, at least part of the recess extending at least partially beneath the patterned silicon layer;

an oxide liner formed on a sidewall of the patterned silicon layer, wherein the oxide liner extends along only part of the sidewall; and a portion of a first layer extending along another part of the sidewall and in a corner at an interface of the patterned silicon layer and the buried insulator layer, and a portion of a first layer formed in the recess beneath the patterned silicon layer, wherein the oxide liner and the portion of the first layer do not overlap, relative the sidewall.

2. The semiconductor device of claim 1, wherein the first layer comprises an insulating material.

3. The semiconductor device of claim 2, wherein the first layer comprises silicon dioxide.

4. The semiconductor device of claim 1, wherein the first layer comprises silicon nitride.

5. The semiconductor device of claim 1, wherein the portion of the first layer covers at least part of the buried insulator layer.

6. The semiconductor device of claim 1, further comprising:

an isolation insulating material at least partially filling a region adjacent to the patterned silicon layer.

7. A semiconductor device, comprising:

a substrate;

a buried insulator layer formed over the substrate;

a patterned silicon layer formed over the buried insulator layer, wherein the buried insulator has a recess formed therein, at least part of the recess extending at least partially beneath the patterned silicon layer;

a portion of a first layer formed in the recess beneath the patterned silicon layer and contacting a portion of a sidewall of the patterned silicon layer; and an oxide liner having a top side facing away from said buried insulator layer and a bottom side facing toward said buried insulator layer, said oxide liner being on the sidewall of the patterned silicon layer and abutting, at least in part, the first layer only at said bottom side, wherein the oxide liner does not extend into the recess beneath the patterned silicon layer.

8. The semiconductor device of claim 7, wherein the oxide liner extends along only a first portion of the sidewall of the patterned silicon layer and wherein the portion of the first layer extends along a second portion of the sidewall of the patterned silicon layer.

9. The semiconductor device of claim 7, wherein the first layer comprises silicon nitride.

10. The semiconductor device of claim 7, wherein the first layer comprises silicon dioxide.

11. The semiconductor device of claim 7, further comprising:

an isolation insulating material at least partially filling a region adjacent to the patterned silicon layer.

12. A semiconductor device comprising:

a silicon wafer;

a buried oxide layer on the silicon wafer, wherein the buried oxide layer has a recess formed therein, at least part of the recess extending at least partially beneath the patterned the patterned silicon layer;

a patterned semiconductor layer on the buried oxide layer, the patterned semiconductor layer comprising a mesa having a sidewall;

a first liner extending along a first portion of the sidewall;

a second liner extending along a second portion of the sidewall, the second liner covering an interface between the mesa and the buried oxide liner, and a portion of a second liner formed in the recess beneath the patterned semiconductor layer, wherein the first liner and the second liner do not overlap, relative the sidewall; and an insulating material contacting the first liner and second liner.

13. The semiconductor device of claim 12 further comprising:

a recess in the buried oxide layer underlying the mesa; and wherein the second liner substantially fills the recess.

14. The semiconductor device of claim 12 wherein the first liner comprises silicon oxide.

15. The semiconductor device of claim 12 wherein the second liner comprises a material selected from the group consisting essentially of silicon oxide and silicon nitride.

16. The semiconductor device of claim 12 wherein the patterned semiconductor layer comprises a second mesa and wherein the insulating material substantially fills a trench between the mesa and the second mesa.

17. The semiconductor device of claim 16 wherein the second liner extends along a surface of the buried oxide layer between the mesa and the second mesa.

18. The semiconductor device of claim 12 wherein the semiconductor layer comprises epitaxially grown silicon.

* * * * *